(12) United States Patent
Kugai et al.

(10) Patent No.: US 6,384,424 B1
(45) Date of Patent: May 7, 2002

(54) SQUID

(75) Inventors: Hirokazu Kugai; Yasuyuki Matsui; Tatsuoki Nagaishi; Hideo Itozaki, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 7 days.

(21) Appl. No.: 09/686,386

(22) Filed: Oct. 11, 2000

(30) Foreign Application Priority Data

Oct. 12, 1999 (JP) .......................................... 11-289751

(51) Int. Cl.[7] .............................................. H01L 29/06
(52) U.S. Cl. .............................. 257/31; 257/33; 257/34; 505/162; 505/238
(58) Field of Search ............................ 257/31, 32, 33, 257/34, 35, 36; 505/162, 238, 701

(56) References Cited

U.S. PATENT DOCUMENTS 5,696,392 A * 12/1997 Char et al. .................. 257/190
5,742,073 A * 4/1998 Jiang et al. .................... 257/34
6,263,219 B1 * 7/2001 Nagaishi ...................... 505/162

OTHER PUBLICATIONS

Yuan, C.W., et al. "Step edge YBa2Cu3O7–d dc SQUIDs on sapphire substrates," Appl. Phys. Lett. 60(20), May 18, 1992, 2552–54.*

Tanaka S. et al., "Properties of $YBa_2Cu_3O_{7-y}$ Large Washer SQUID", Jpn. J. Appl. Phys. vol. 32 (1993) pp. 662–664.

Denhoff M. W. et al. "Epitaxial $Y_1Ba_2CU_3O$, hin fims on $CeO_2$ buffer ;ayers on sapphire substrates", J. Appl. Phys. 70 (1991) pp. 3986–3988.

Yuan C. W. et al. "Step edge $YBa_2Cu_3O_{7-\delta}$dc SQUID on sapphire substrates", appl. Phys. Lett. 60 (1992) pp. 2552–2554.

Edwards J. A. et al. "$YBa_2Cu_3O_7$ thin–film step junction on MgO substrates", Appl. Phys. Lett. 60 (1992) pp. 2433–2435.

* cited by examiner

*Primary Examiner*—Sara Crane
(74) *Attorney, Agent, or Firm*—Foley & Lardner

(57) ABSTRACT

A superconducting thin film pattern (20) formed from an oxide superconducting thin film is formed on a sapphire substrate (10) having a step (11) via a $CeO_2$ buffer layer, and the step (11) and superconducting thin film pattern (20) are formed such that the step (11) crosses a predetermined portion of a square thin film pattern (22) having an opening portion (23) at the central portion. Step-edge Josephson junctions (26, 27) are formed at the portion crossed by the step (11), and a SQUID is obtained. The sapphire substrate is relatively inexpensive, and a large substrate can be used.

6 Claims, 2 Drawing Sheets

SQUID

BACKGROUND OF THE INVENTION

1. Field of the Invention

The present invention relates to a SQUID (Superconducting QUantum Interference Device).

2. Related Background Art

A SQUID is constructed by forming at least one Josephson junction in a superconducting loop and used for an element such as a magnetometer capable of accurately measuring a magnetic field or a gradiometer.

Josephson junctions of some types are used in superconducting loops, and one of them is a step-edge Josephson junction. In the step-edge Josephson junction, a step having a predetermined shape is formed on a substrate on which a superconducting loop is to be formed by a superconducting thin film pattern. A superconducting thin film pattern is formed on the substrate such that the step crosses a predetermined portion of the superconducting loop by a superconducting thin film. At this time, a Josephson junction is obtained using weak link formed at the superconducting thin film pattern portion on the step.

SUMMARY OF THE INVENTION

To form the above-described step-edge Josephson junction using a thin film pattern formed from an oxide superconducting thin film, an $SrTiO_3$ substrate is generally used as a substrate because a satisfactory oxide superconducting thin film can be formed (Jpn. J. Appl. Phys., Vol. 32 (1993), pp. 662–664). However, an $SrTiO_3$ substrate is expensive, and a large $SrTiO_3$ substrate is unavailable. Since the number of SQUIDs which can be manufactured from a single wafer substrate decreases, the manufacturing efficiency is low.

For a SQUID magnetometer, to increase the magnetic field detection sensitivity, the area of a SQUID may be required to be large by, e.g., making the SQUID size large to increase the flux capture area. However, the above-described SQUID can hardly cope with an increase in area.

The present invention has been made to solve the above-described problems, and has as its object to provide a SQUID which has a step-edge Josephson junction and is capable of attaining cost reduction and large area of the element.

In order to achieve the above object, according to the present invention, there is provided a SQUID comprising a sapphire substrate, and a superconducting thin film pattern formed from an oxide superconducting thin film formed on the sapphire substrate via a $CeO_2$ buffer layer and including a SQUID pattern, wherein a Josephson junction included in the SQUID pattern comprises a step-edge Josephson junction formed on a step on the sapphire substrate.

The sapphire substrate used in the above SQUID is relatively inexpensive, and the substrate size can be made large. However, a technique of manufacturing a SQUID by forming a step-edge Josephson junction in forming a superconducting thin film pattern on a sapphire substrate has not been established.

In accordance with the results of examinations and experiments conducted by the present inventor, when a superconducting thin film pattern formed from an oxide superconducting thin film is formed on a sapphire substrate via a $CeO_2$ buffer layer, and a step is formed on the sapphire substrate such that it crosses a predetermined portion of the thin film pattern, a step-edge Josephson junction for causing the element to perform the SQUID operation can be obtained. The present inventor completed the present invention on the basis of this finding. Hence, the SQUID having a step-edge Josephson junction can be made inexpensive. In addition, since a large sapphire substrate can be used, the area of the SQUID can be increased, and the manufacturing efficiency can be improved.

The present invention will be more fully understood from the detailed description given hereinafter and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description,

DESCRIPTION OF THE PREFERRED EMBODIMENT

Figure 1:
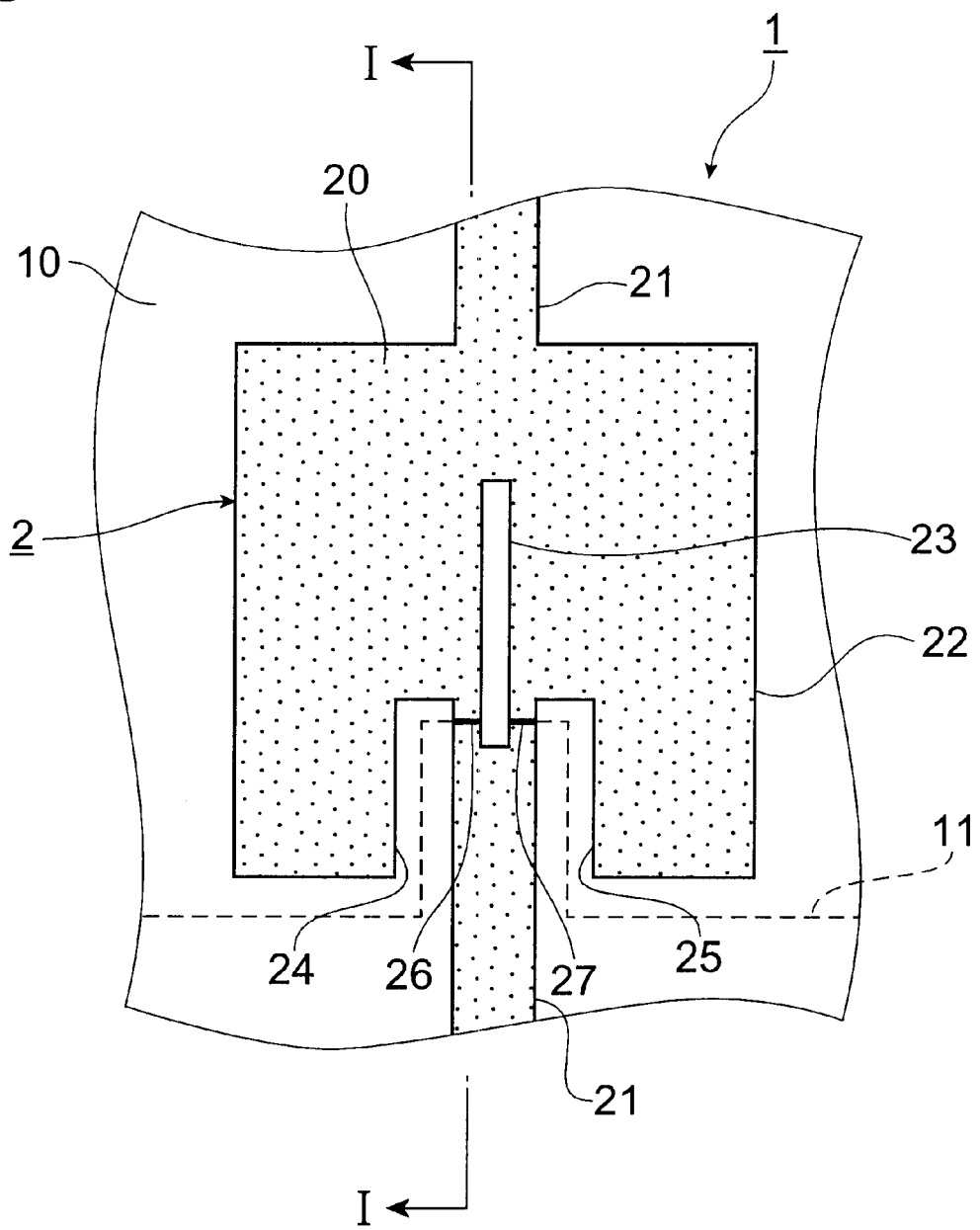
FIG. 1 is a partially enlarged plan view showing a SQUID according to an embodiment.

A SQUID according to a preferred embodiment of the present invention will be described below in detail with reference to the accompanying drawings. The same reference numerals denote the same elements throughout the drawings, and a redundant description thereof will be omitted. The dimensional ratio in the drawings does not always match that in the description.

FIG. 1 is a plan view showing a SQUID according to an embodiment of the present invention. FIG. 1 shows an enlarged view of a range including a superconducting thin film pattern portion where a SQUID pattern is formed in the SQUID, and the remaining thin film patterns are not illustrated.

A SQUID 1 has a sapphire substrate 10 and a superconducting thin film pattern 20 formed on the sapphire substrate 10. On the sapphire substrate 10, a step having a predetermined angle and height is formed along a dashed line 11 shown in FIG. 1.

The superconducting thin film pattern 20 has a thin film pattern 21 extending in the vertical direction in FIG. 1, and a square thin film pattern 22 having an outer size of 5 mm×5 mm and formed at a predetermined position on the thin film pattern 21. A 5-$\mu$m wide, 100-$\mu$m long opening portion 23 is formed at the central portion of the thin film pattern 22 along the direction in which thin film pattern 21 extends.

On the lower side of the square thin film pattern 22, concave pattern portions 24 and 25 are formed at predetermined positions on the left and right sides of the thin film pattern 21 connected to the thin film pattern 22. The inner sides of the concave pattern portions 24 and 25, i.e., the upper-end-side portions of the sides extending in the vertical direction and facing the thin film pattern 21, oppose the lower-end-side portions of the left and right sides of the opening portion 23, respectively.

The step 11 on the sapphire substrate 10 is formed along a line that crosses the thin film pattern 22 between the concave pattern portions 24 and 25 so as to pass through regions in the concave pattern portions 24 and 25 where the superconducting thin film pattern 20 is not formed and also pass through a position in the opening portion 23.

The step 11 crosses a thin film pattern portion sandwiched between the right side of the concave pattern portion 24 and the left side of the opening portion 23 and a thin film pattern portion sandwiched between the left side of the concave pattern portion 25 and the right side of the opening portion 23. Thus, step-edge Josephson junctions are formed at two portions 26 and 27 crossed by the step 11, respectively. A SQUID pattern 2 included in the superconducting thin film pattern 20 of this embodiment is constructed by the above-described square thin film pattern 22, opening portion 23, and step-edge Josephson junctions 26 and 27.

Figure 2:
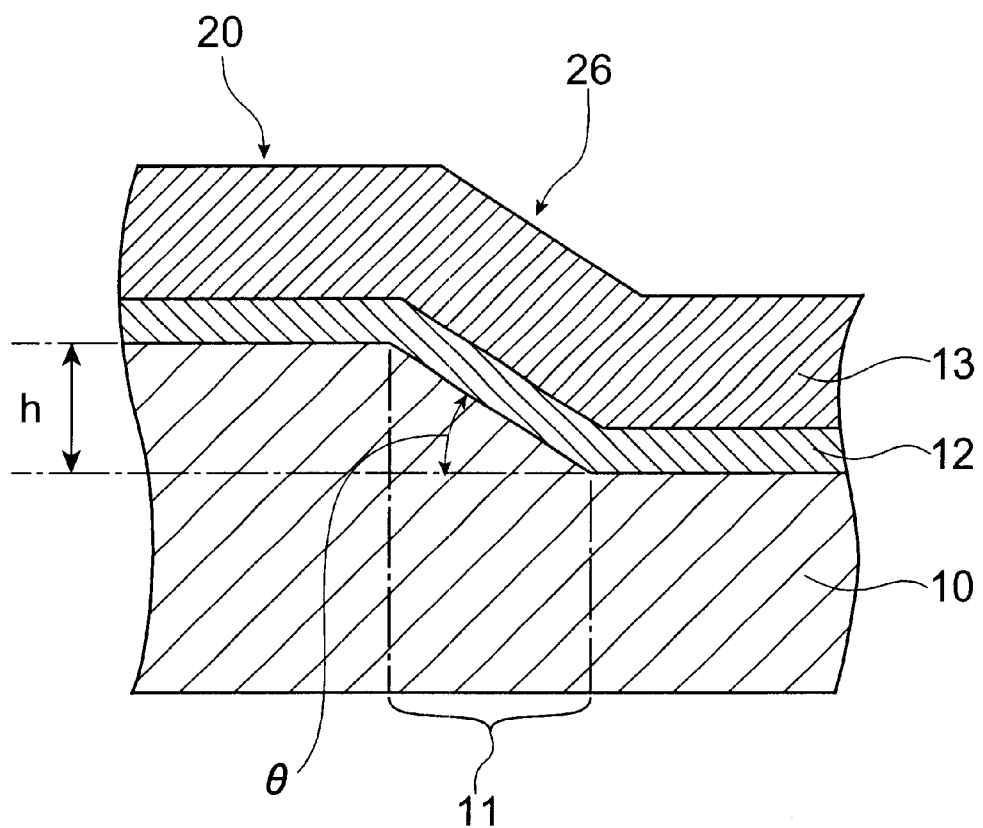
FIG. 2 is a sectional view of the SQUID shown in FIG. 1, which is taken along an arrow I—I therein.

FIG. 2 is a sectional view of the SQUID shown in FIG. 1, which is taken along an arrow I—I therein. FIG. 2 shows an enlarged view of a sectional structure near the step-edge Josephson junction 26.

The superconducting thin film pattern 20 of this embodiment is formed by sequentially forming a buffer layer 12 formed from a $CeO_2$ (cerium oxide) thin film and an oxide superconducting thin film 13 on the sapphire substrate 10. The sapphire substrate 10 also has the step 11 having a predetermined step angle $\theta$ and step height h, as shown in FIG. 2.

When the superconducting thin film pattern 20 is formed on the sapphire substrate 10 such that the step 11 crosses a predetermined portion of the superconducting thin film pattern 20, the step-edge Josephson junction 26 is obtained, as described above. More specifically, when the step 11 crosses the superconducting thin film pattern 20 formed from the oxide superconducting thin film 13 via the $CeO_2$ buffer layer 12, weak link is formed at the superconducting thin film portion which covers the step 11 whereby the step-edge Josephson junction 26 is obtained. The step angle $\theta$ and step height h of the step 11 are the same for the step-edge Josephson junctions 26 and 27.

The effect and preferable structural conditions of the SQUID according to the above-described embodiment will be described.

In this embodiment, not an $SrTiO_3$ substrate which is generally used, but the sapphire substrate 10 is used for a SQUID having a step-edge Josephson junction using a thin film pattern of an oxide superconductor. The sapphire substrate is relatively inexpensive, and a large sapphire substrate is available.

The $CeO_2$ buffer layer 12 and oxide superconducting thin film 13 are sequentially formed on the sapphire substrate 10, thereby forming the superconducting thin film pattern 20. Thus, a SQUID can be obtained, in which a step-edge Josephson junction that enables the SQUID operation of the element is formed at a portion where the step 11 on the sapphire substrate 10 crosses the superconducting thin film pattern 20. A technique of forming an oxide superconducting thin film on a normal sapphire substrate via a $CeO_2$ buffer layer is described in, e.g., J. Appl. Phys. 70 (1991), pp. 3986–3988.

When a $CeO_2$ thin film is used as a buffer layer, an oxide superconducting thin film having a satisfactory crystal state can be formed on the sapphire substrate. However, a technique of manufacturing a SQUID by forming a step-edge Josephson junction in this structure has not been established. In accordance with the results of examinations and experiments conducted by the present inventor, a step-edge Josephson junction capable of SQUID operation on a sapphire substrate can be formed using the above-described structure. The present inventor completed the SQUID of the present invention on the basis of this finding.

As for manufacturing a SQUID using a sapphire substrate, a technique of forming a steep step on a substrate and forming an oxide superconducting thin film via an MgO buffer layer is described in Appl. Phys. Lett. 60 (1992), pp. 2552–2554. Additionally, a technique of forming an oxide superconducting thin film on an MgO substrate to manufacture a SQUID having a step angle of about 30° is described in Appl. Phys. Lett. 60 (1992), pp. 2433–2435. However, when an MgO buffer layer or MgO substrate is used, the crystal state or characteristics of the obtained oxide superconducting thin film cannot be sufficiently improved.

To the contrary, for the SQUID of the above-described embodiment, a step-edge Josephson junction is formed using a structure in which an oxide superconducting thin film is formed on a sapphire substrate via a $CeO_2$ buffer layer, thereby reducing the cost of SQUID. In addition, since a large sapphire substrate is available, the area of the SQUID can be increased, and the manufacturing efficiency can be improved. Furthermore, by using a $CeO_2$ thin film as a buffer layer, the crystal state and characteristics of the oxide superconducting thin film forming the superconducting thin film pattern are improved, thereby obtaining a SQUID capable of achieving a satisfactory superconducting characteristic and SQUID operation.

As an oxide superconducting thin film, an HoBaCuO-based oxide superconductor such as a $HoBa_2Cu_3O_{7-x}$ thin film is preferably used. With this material, a superconducting thin film pattern having especially satisfactory crystal state and characteristics can be formed.

According to the results of experiments conducted by the present inventors, as preferable structural conditions of the step 11 on the sapphire substrate 10, the $CeO_2$ buffer layer 12, and the oxide superconducting thin film 13, the step angle $\theta$ of the step 11 is preferably from 15° inclusive to 45° exclusive, and the step height h is preferably 100 nm to 600 nm both inclusive.

The thickness of the $CeO_2$ buffer layer 12 is preferably from 10 nm inclusive to 60 nm exclusive. The thickness of the oxide superconducting thin film 13 is preferably 100 nm to 300 nm both inclusive.

When these conditions are applied, the characteristics of the SQUID can be particularly improved.

The characteristics and preferable structural conditions of the SQUID 1 according to the above-described embodiment will be described below in more detail on the basis of examples and comparative examples. The structures of the superconducting thin film pattern 20 and SQUID pattern 2 formed at part of the superconducting thin film pattern 20 in the examples and comparative examples are the same as those in FIGS. 1 and 2.

EXAMPLE 1

A step 11 was formed on a sapphire substrate 10 by photolithography and ion milling etching. The step height of the step 11 was h=250 nm, and the step angle was $\theta$=30°. A $CeO_2$ buffer layer 12 and oxide superconducting thin film 13 formed from $HoBa_2Cu_3O_{7-x}$ were sequentially formed on the substrate 10 by laser deposition, as shown in FIG. 2. The thickness of the $CeO_2$ buffer layer 12 was 30 nm, and the thickness of the $HoBa_2Cu_3O_{7-x}$ thin film 13 was 120 nm.

After that, a superconducting thin film pattern 20 shown in FIG. 1, including a SQUID pattern 2, was formed by patterning using photolithography. The width of step-edge Josephson junctions 26 and 27 was 3 µm. The SQUID inductance was 30 pH.

When the resultant SQUID was dipped in liquid nitrogen, and its characteristics were measured, a satisfactory SQUID operation was obtained. The modulation voltage of the SQUID was Vpp=10 µV.

EXAMPLE 2

A SQUID was manufactured following the same procedures as in Example 1. The step angle was θ=15°. When the resultant SQUID was dipped in liquid nitrogen, and its characteristics were measured, a satisfactory SQUID operation was obtained. The modulation voltage of the SQUID was Vpp=1 µV.

EXAMPLE 3

A SQUID was manufactured following the same procedures as in Example 1. The step angle was θ=40°. When the resultant SQUID was dipped in liquid nitrogen, and its characteristics were measured, a satisfactory SQUID operation was obtained. The modulation voltage of the SQUID was Vpp=5 µV.

EXAMPLE 4

A SQUID was manufactured following the same procedures as in Example 1. The thickness of the $CeO_2$ buffer layer was 10 nm. When the resultant SQUID was dipped in liquid nitrogen, and its characteristics were measured, a satisfactory SQUID operation was obtained. The modulation voltage of the SQUID was Vpp=2 µV.

EXAMPLE 5

A SQUID was manufactured following the same procedures as in Example 1. The thickness of the $CeO_2$ buffer layer was 55 nm. When the resultant SQUID was dipped in liquid nitrogen, and its characteristics were measured, a satisfactory SQUID operation was obtained. The modulation voltage of the SQUID was Vpp=4 µV.

COMPARATIVE EXAMPLE 1

A SQUID was manufactured following the same procedures as in Example 1. The step angle was θ=10°. The resultant SQUID was dipped in liquid nitrogen, and its characteristics were measured. The critical current value exceeded 1 mA to disable the SQUID operation.

COMPARATIVE EXAMPLE 2

A SQUID was manufactured following the same procedures as in Example 1. The step angle was θ=45°. The resultant SQUID was dipped in liquid nitrogen, and its characteristics were measured. The critical current value was 0, and no superconducting characteristic was exhibited to disable the SQUID operation.

COMPARATIVE EXAMPLE 3

A SQUID was manufactured following the same procedures as in Example 1. The thickness of the $CeO_2$ buffer layer was 9 nm. The $HoBa_2Cu_3O_{7-x}$ thin film was not satisfactorily grown on the step. The resultant SQUID was dipped in liquid nitrogen, and its characteristics were measured. No superconducting characteristic was exhibited to disable the SQUID operation.

COMPARATIVE EXAMPLE 4

A SQUID was manufactured following the same procedures as in Example 1. The thickness of the $CeO_2$ buffer layer was 60 nm. The smoothness of the $CeO_2$ buffer layer surface was poor, and the $HoBa_2Cu_3O_{7-x}$ thin film was not satisfactorily grown as a whole. The resultant SQUID was dipped in liquid nitrogen, and its characteristics were measured. No superconducting characteristic was exhibited to disable the SQUID operation.

ABOUT EXAMPLES AND COMPARATIVE EXAMPLES

As is apparent from Examples 1 to 5, the SQUID operation based on satisfactory characteristics is obtained, and in the structure of the SQUID according to the present invention, a SQUID having a step-edge Josephson junction that satisfactorily functions is obtained.

On the other hand, in Comparative Examples 1 to 4 in which the step angle θ of the step or the thickness of the $CeO_2$ buffer layer was further changed, the superconducting characteristics or SQUID operation is not obtained. This also applies to the step height h or the thickness of the oxide superconducting thin film 13, though not indicated in the above-described examples and comparative examples.

As described above, the shape of the step 11 to be formed on the sapphire substrate 10 and the thicknesses of the $CeO_2$ buffer layer 12 and oxide superconducting thin film 13 are preferably set within the preferable numerical ranges described in the above embodiment to form a step-edge Josephson junction such that sufficient characteristics are obtained.

For the oxide superconducting thin film 13, another oxide high-temperature superconducting material may be used in place of the $HoBa_2Cu_3O_{7-x}$ thin film. In addition, the preferable numerical ranges of the structural conditions such as the angle and film thickness may change depending on the superconducting material used, the pattern shape such as the width of Josephson junction, or correlation between the structural conditions. Hence, preferable structural conditions for the manufacture of a SQUID are preferably determined on the basis of the structure of each SQUID.

As has been described above in detail, the SQUID according to the present invention has the following effects. In the SQUID having a step-edge Josephson junction, a sapphire substrate is used as a substrate on which a thin film pattern of an oxide superconducting thin film is to be formed. The sapphire substrate is relatively inexpensive and available. Hence, the SQUID can be made inexpensive. Since a large sapphire substrate can be used, the number of SQUIDs which can be manufactured from a single wafer substrate can be increased to improve the manufacturing efficiency. The size of a SQUID to be manufactured can be made large.

A $CeO_2$ thin film is used as a buffer layer for the oxide superconducting thin film. This improves the crystal state and characteristics of the oxide superconducting thin film and makes it possible to obtain a step-edge Josephson junction that has satisfactory characteristics and enables the SQUID operation.

According to such a SQUID, the degree of freedom for the structure of the SQUID to be manufactured can be increased. For this reason, SQUIDs having various application purposes and performances can be manufactured, so a SQUID having excellent performance, e.g., a SQUID magnetometer having an improved magnetic field sensitivity can be obtained.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A SQUID comprising:

a sapphire substrate; and a superconducting thin film pattern formed from an oxide superconducting thin-film formed on said sapphire substrate via a $CeO_2$ buffer layer and including a SQUID pattern, wherein a Josephson junction included in the SQUID pattern comprises a step-edge Josephson junction formed on a step on said sapphire substrate.

2. A SQUID according to claim 1, wherein the oxide superconducting thin film is formed from an HoBaCuO-based oxide superconductor.

3. A SQUID according to claim 1, wherein the step formed on said sapphire substrate has an angle of 15° inclusive to 45° exclusive.

4. A SQUID according to claim 1, wherein the $CeO_2$ buffer layer has a thickness of 10 nm inclusive to 60 nm exclusive.

5. A SQUID according to claim 1, wherein the oxide superconducting thin film has a thickness of 100 nm to 300 nm both inclusive.

6. A SQUID according to claim 1, wherein the step formed on said sapphire substrate has a height of 100 nm to 600 nm both inclusive.

* * * * *